US008605985B2

(12) United States Patent
Fukaya et al.

(10) Patent No.: US 8,605,985 B2
(45) Date of Patent: Dec. 10, 2013

(54) PATTERN MEASUREMENT APPARATUS AND PATTERN MEASUREMENT METHOD

(75) Inventors: Hiroshi Fukaya, Tokyo (JP); Jun Matsumoto, Tokyo (JP)

(73) Assignee: Advantest Corp., Tokyo (JP)

( * ) Notice: Subject to any disclaimer, the term of this patent is extended or adjusted under 35 U.S.C. 154(b) by 187 days.

(21) Appl. No.: 13/066,939

(22) Filed: Apr. 28, 2011

(65) Prior Publication Data
US 2011/0206271 A1 Aug. 25, 2011

Related U.S. Application Data

(63) Continuation of application No. PCT/JP2009/068681, filed on Oct. 30, 2009.

(51) Int. Cl.
*G06K 9/00* (2006.01)

(52) U.S. Cl.
USPC .......................................... 382/144

(58) Field of Classification Search
None
See application file for complete search history.

(56) References Cited

U.S. PATENT DOCUMENTS

| | | | | |
|---|---|---|---|---|
| 6,480,807 | B1 * | 11/2002 | Miyano | 702/159 |
| 6,724,947 | B1 * | 4/2004 | Hayes | 382/286 |
| 6,909,791 | B2 * | 6/2005 | Nikitin et al. | 382/108 |
| 6,963,819 | B2 * | 11/2005 | Ikeda et al. | 702/152 |
| 2003/0021463 | A1 * | 1/2003 | Yamaguchi et al. | 382/145 |
| 2004/0195507 | A1 * | 10/2004 | Yamaguchi et al. | 250/310 |
| 2006/0110143 | A1 * | 5/2006 | Ito et al. | 392/388 |
| 2008/0069452 | A1 * | 3/2008 | Matsumoto | 382/207 |
| 2009/0202140 | A1 | 8/2009 | Mitsui | |

FOREIGN PATENT DOCUMENTS

| | | |
|---|---|---|
| JP | 10-339615 | 12/1998 |
| JP | 2001-183116 | 7/2001 |
| JP | 2002-162216 | 6/2002 |
| JP | 2002-296761 | 10/2002 |
| JP | 2004-125690 | 4/2004 |

OTHER PUBLICATIONS

Office action issued by Japanese Patent Office for the counterpart Japanese patent application and its English translation.

* cited by examiner

*Primary Examiner* — Samir Ahmed
(74) *Attorney, Agent, or Firm* — Muramatsu & Associates

(57) ABSTRACT

A pattern measurement apparatus includes: an irradiation unit for irradiating a sample with an electron beam; an electron detection unit for detecting the amount of electrons generated from the sample on which a pattern is formed; an image processor for generating an SEM image of the pattern based on the amount of electrons; and a controller for acquiring a rectangular measurement specification region of the SEM image and calculating a loss ratio of a corner portion of the pattern from areas of the measurement specification region and the corner portion of the pattern. The controller detects edge positions in a predetermined range including a position where a corner of the measurement specification region intersects with a side of the SEM image, and adjusts the measurement specification region in accordance with the edge positions.

12 Claims, 10 Drawing Sheets

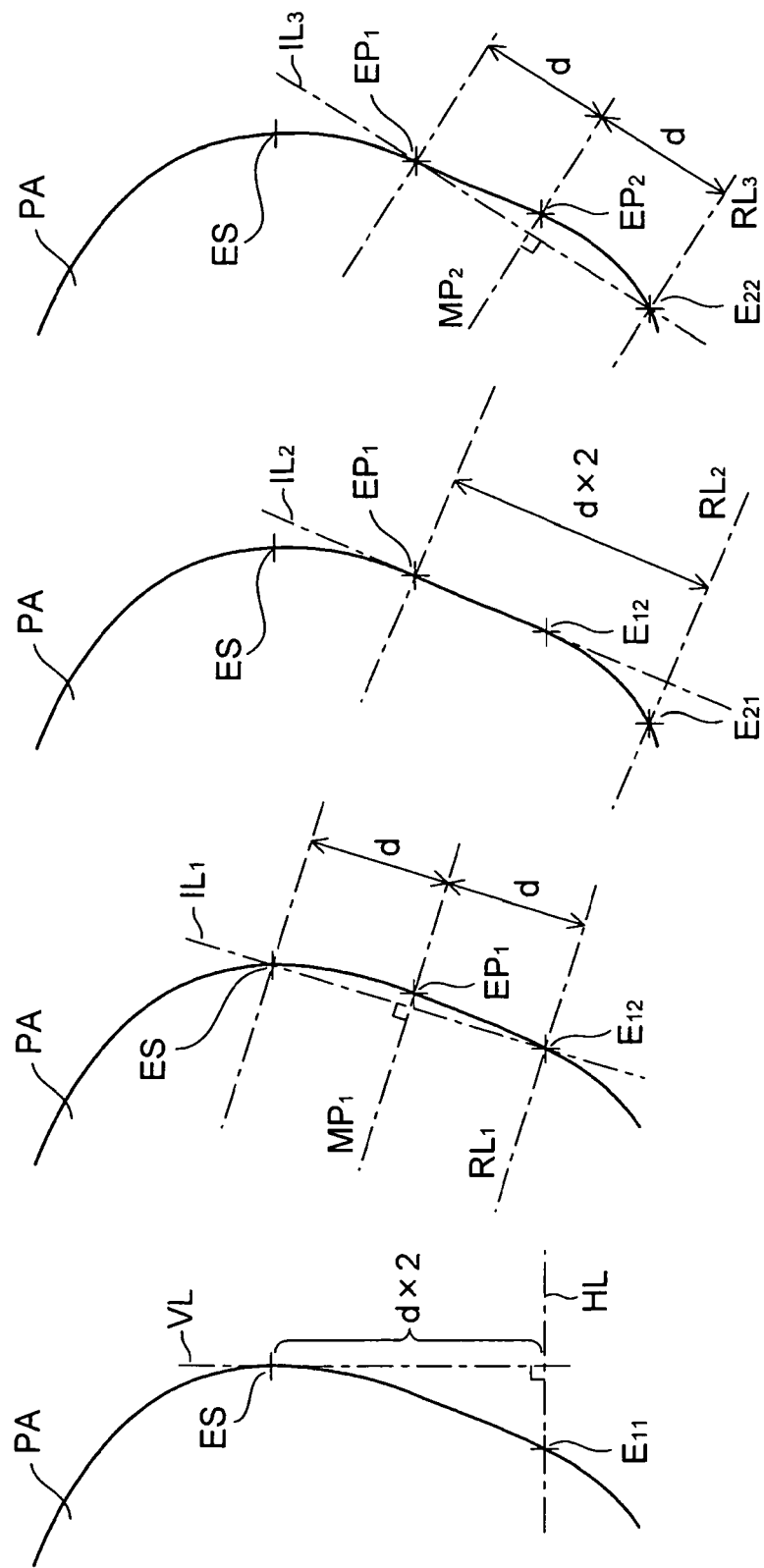

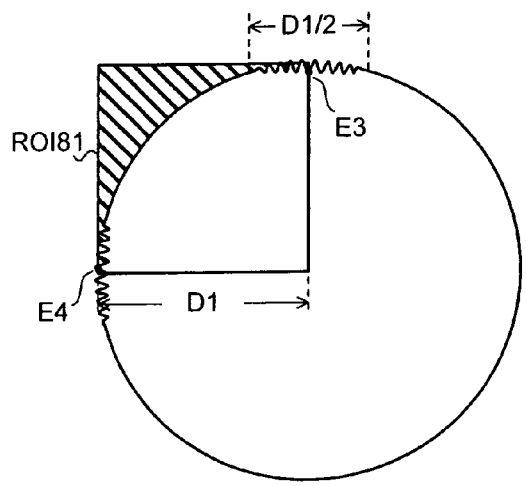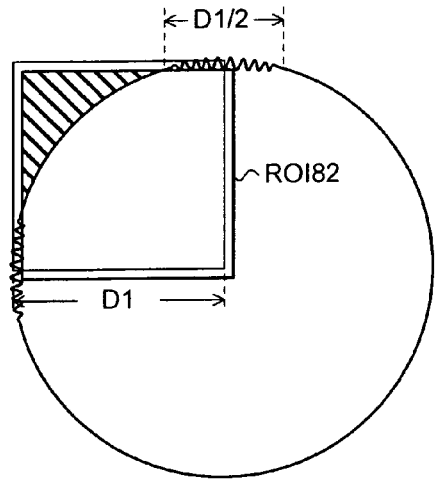
Fig. 9A　　　Fig. 9B
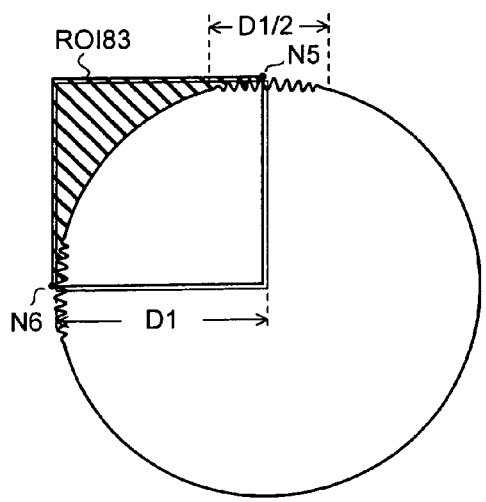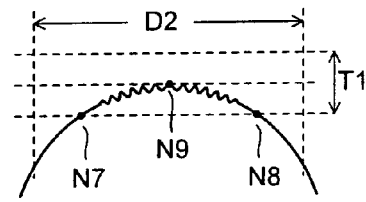
Fig. 9C　　　Fig. 9D

PATTERN MEASUREMENT APPARATUS AND PATTERN MEASUREMENT METHOD

CROSS-REFFERENCE TO THE RELATED ART

This application is a continuation of prior International Patent Application No. PCT/JP2009/068681, filed Oct. 30, 2009, the entire contents of which are incorporated herein by reference.

BACKGROUND OF THE INVENTION

1. Field of the Invention

The present invention relates to a pattern measurement apparatus and a pattern measurement method. More particularly, the present invention relates to a pattern measurement apparatus and a pattern measurement method capable of measuring corner shapes of an OPC pattern, a contact hole or the like with high accuracy.

2. Description of the Prior Art

In a lithography process of a semiconductor manufacturing process, a pattern formed on a photomask is transferred onto a wafer by exposure using an exposure apparatus. When a defect or distortion exists in the pattern formed on this photomask, the accuracy of exposure is reduced. For example, the pattern may not be transferred to a desired position, or the shape of the pattern may become inaccurate. In order to prevent such a reduction in the accuracy of exposure, the photomask is inspected for positional error or defect.

As a method of inspecting a photomask, there is an inspection method using an SEM image of a mask acquired by a scanning electron microscope. The scanning electron microscope irradiates an electron beam scanning region of a sample with incident electrons while scanning, obtains secondary electrons emitted from the sample with a scintillator, acquires SEM image data by converting the amount of electrons obtained in the aforementioned manner into a luminance value, and displays the SEM image on a display.

The inspection using a line width of the pattern formed on the photomask is conducted by the following procedure, for example. A predetermined region of the pattern formed on the photomask is shown on the display, and thereafter, an electron beam is emitted and directed to the measurement point within the display range. Thereafter, a luminance distribution waveform is obtained on the basis of secondary electrons reflected from the measurement point. Then, the luminance distribution waveform is analyzed to find pattern edge positions, thereby determining a line width. Thereafter, whether or not the line width is within a range of tolerance is determined to judge the quality of the photomask.

A phenomenon called "rounding" may occur in which a corner of the pattern is rounded instead of forming a right angle. In a case where such a pattern is formed as a capacitor electrode, for example, the desired capacitance value thereof may not be obtained due to the generation of a portion where no pattern is formed by the corner rounding. There has been a demand to accurately find the degree of formation of such a portion where no pattern is formed (area loss).

As described above, it is important to measure the line width or area of a pattern in the manufacturing process of a photomask. Thus, various techniques for measuring the line width or area have been proposed. As a technique relating to the aforementioned measurement, a technique of a pattern area measurement method capable of measuring the area of a pattern with high accuracy is described in International Patent Publication No. WO /2008/032488.

In addition, Japanese Patent Application Publication No. 2009-188239 describes a technique to divide the profile of a design pattern into straight-line portions and corner portions and then to individually evaluate the portions.

Meanwhile, when an SEM image of a pattern is acquired, it involves edge roughness on the pattern. Thus, every time an SEM image is acquired, different edge roughness is obtained from even the same pattern. For this reason, when the profile of a pattern is detected with high accuracy, the region specified as the measurement target range changes depending on the edge roughness. Accordingly, every time the measurement is performed on even the same pattern, the measurement region differs, and the calculated area value of a corner of the pattern also differs, for example. Thus, the reproducibility of pattern measurement is insufficient, thus decreasing the accuracy of pattern measurement.

SUMMARY OF THE INVENTION

The present invention has been made in view of the aforementioned problems. Thus, an objective of the invention is to provide a pattern measurement apparatus and a pattern measurement method capable of measuring a corner shape of a pattern with high accuracy by reducing the influence of noise or edge roughness of an SEM image.

The above described problems are solved with a pattern measurement apparatus including: an irradiation unit for irradiating a sample with an electron beam; an electron detection unit for detecting an amount of electrons generated, by the electron beam radiation, from the sample on which a pattern is formed; an image processor for generating an SEM image of the pattern on the basis of the amount of electrons; and a controller for acquiring a rectangular measurement specification region specifying a measurement target portion of the SEM image, and then calculating a loss ratio of a corner portion of the pattern from an area of the measurement specification region and an area of the corner portion of the pattern, in which the controller detects an edge position in a predetermined range including a position where a corner of the measurement specification region and a side of the SEM image intersect with each other, and then adjusts the measurement specification region in accordance with the edge position.

In the pattern measurement apparatus according to the aforementioned aspect, the controller may calculate an average position of the edge position in the predetermined range, and move the measurement specification region in such a way that the corner of the measurement specification region coincides with the average position. When the edge position in the predetermined range continuously exists at coordinate positions outside a predetermined threshold range, the controller may move the measurement specification region in such a way that the corner coincides with a coordinate position outermost in a direction perpendicular to a side along an edge of the pattern of the measurement specification region among coordinate positions in the predetermined range. When the edge position in the predetermined range continuously exists at coordinate positions outside a predetermined threshold range, the controller may move the measurement specification region in such a way that the corner coincides with an average position of a length within the predetermined threshold range. When determining that the pattern has a shape in which a recessed corner and a protruding corner are formed continuously, the controller may limit the range for acquiring the average value to a range within the measurement specification region.

According to another aspect of the present invention, a pattern measurement method to be executed in the pattern measurement apparatus according to the aforementioned aspect is provided.

The pattern measurement method according to the aforementioned aspect is a pattern measurement method to be executed in a pattern measurement apparatus including an irradiation unit for irradiating a sample with an electron beam; an electron detection unit for detecting an amount of electrons generated, by the electron beam radiation, from the sample on which a pattern is formed; and an image processor for generating an SEM image of the pattern on the basis of the amount of the electrons, the method includes the steps of: acquiring a rectangular measurement specification region specifying a measurement target portion of the SEM image; acquiring a position where a corner of the measurement specification region and a side of the SEM image intersect with each other; detecting an edge position in a predetermined range including the intersecting position; and adjusting the measurement specification region in accordance with the detected edge position.

In the pattern measurement method according to the aforementioned aspect, the step of adjusting the measurement specification region may include the steps of: calculating an average position of edge positions in the predetermined range including the intersecting position; and moving the measurement specification region in such a way that the corner coincides with the calculated average position. The step of adjusting the measurement specification region may include the steps of: determining whether or not the edge position in the predetermined range is continuously detected at coordinate positions outside a predetermined threshold range; and moving the measurement specification region in such a way that the corner coincides with a coordinate position outermost in a direction perpendicular to a side along an edge of the pattern of the measurement specification region among coordinate positions in the predetermined range when it is determined that the edge position is detected continuously at the coordinate positions. The step of adjusting the measurement specification region may include the steps of: determining whether or not the edge position in the predetermined range is continuously detected at coordinate positions outside a predetermined threshold range; and moving the measurement specification region in such a way that the corner coincides with an average position of a length within the predetermined threshold range when it is determined that the edge position is detected continuously at the coordinate positions. The step of adjusting the measurement specification region may include the steps of: determining shapes of corners which are continuous; and limiting the range for acquiring the average value to a range within the measurement specification region, when the continuous corners is determined to be in a pattern with a shape in which a recessed corner and a protruding corner exits continuously.

In the pattern measurement apparatus and the pattern measurement method according to the present invention, an edge position in a predetermined range is detected for an ROI (region of interest, i.e., measurement specification region) to be set when corner rounding of a pattern is measured, and the ROI is adjusted in accordance with the edge position. For example, an average value of the edge position in a predetermined range including, as the center of the range, a point where a corner of the ROI and a side of the pattern intersect with each other is calculated, and then, the ROI is moved so that the corner of the ROI coincides with the position corresponding to the average value. Accordingly, the influence of edge roughness appearing on the SEM image of the pattern can be made smaller. Thus, the measurement accuracy of, for example, a loss area or a loss ratio of corner rounding can be improved.

BRIEF DESCRIPTION OF THE DRAWINGS

FIGS. 6A to 6D are diagrams for describing the pattern profile measurement processing;

FIGS. 9A to 9D are diagrams for describing the optimum rearrangement of an ROI for a case where the area of a measurement target pattern is small.

DESCRIPTION OF THE PREFERRED EMBODIMENTS

Hereinafter, a description is given of an embodiment of the present invention with reference to the accompanying drawings.

Firstly, a description is given of a configuration of a scanning electron microscope used as a pattern measurement apparatus. Next, a description is given of processing for measuring corner rounding with a good reproducibility in an SEM image of a contact hole or the like.
(Configuration of Scanning Electron Microscope)

Figure 1:
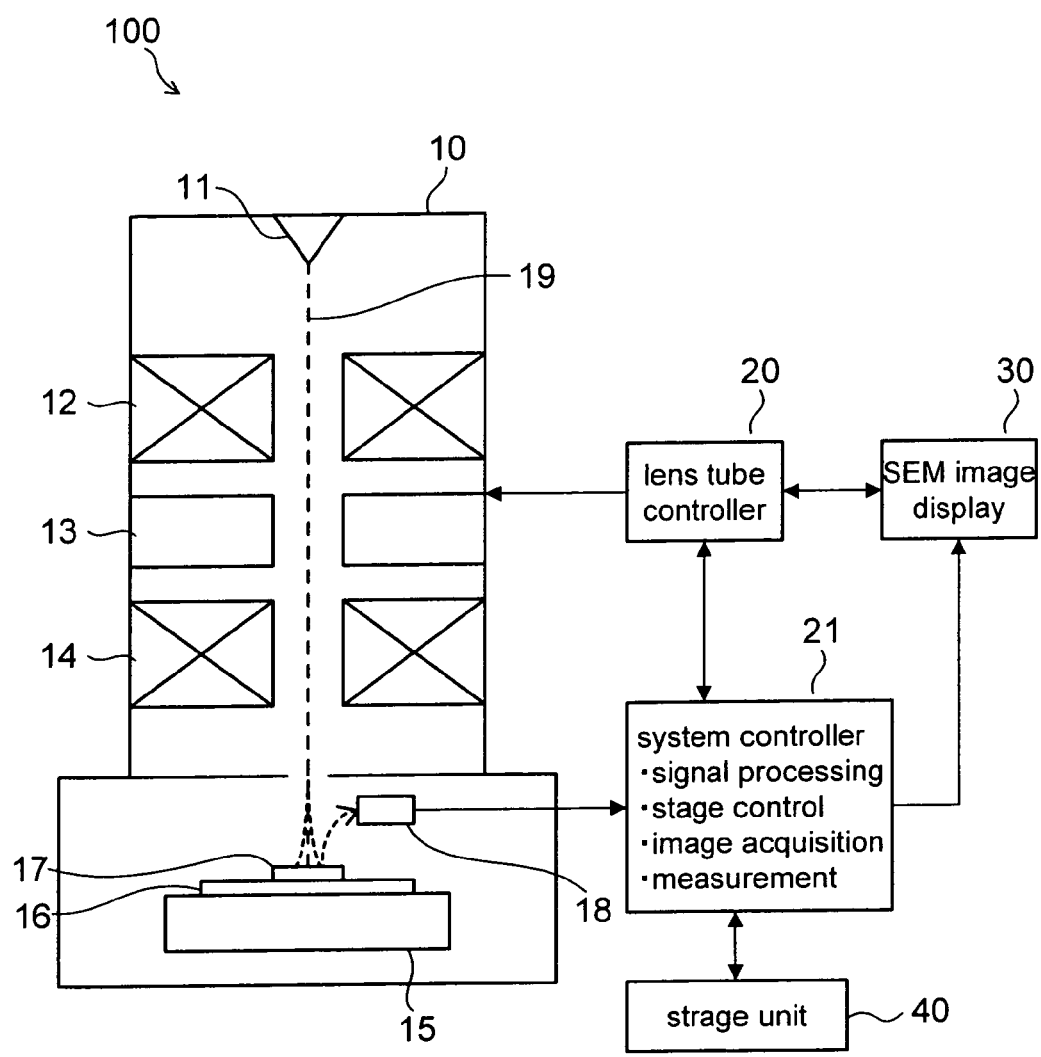
FIG. 1 is a configuration diagram of a scanning electron microscope used in an embodiment of the present invention.

FIG. 1 is a configuration diagram of a scanning electron microscope according to the embodiment.

This scanning electron microscope 100 is roughly configured of an electron scanning unit 10, a lens tube controller 20, an SEM image display 30, a storage unit 40 and a system controller 21 controlling the electron scanning unit 10, the lens tube controller 20, the SEM image display 30 and the storage unit 40.

The electron scanning unit 10 includes an electron gun 11, a condenser lens 12, a deflection coil 13, an object lens 14, a moving stage 15 and a sample holder 16.

Charged particles 19 emitted from the electron gun 11 are directed to a sample 17 on the moving stage 15 via the condenser lens 12, the deflection coil 13 and the object lens 14.

The charged particles 19 (primary electron beam) are directed to the sample 17 while the surface of the sample 17 is two-dimensionally scanned with the charged particles 19. Then, an electron detector 18 configured of a scintillator and the like detects secondary electrons emitted from the portion of the sample 17 irradiated with the charged particles 19. The amount of detected secondary electrons is converted into a digital amount by an AD converter of the system controller 21 and is then stored in the storage unit 40 as image data. The image data is converted into luminance signals and then displayed on the SEM image display 30. The image data is arranged on a two-dimensional array so as to be arranged on the same position as the scanning position as the scanning position of the primary electron beam on the sample 17. Thus, a two dimensional digital image is acquired. The luminance data is represented by pixels of this two dimensional digital image each having 8-bit information.

The tube lens controller 20 controls the deflected amount of electrons by the deflection coil 13 and the amount of image to be scanned by the SEM image display 30.

In addition to the aforementioned signal processing and image acquisition processing, other processing such as stage control for moving the stage to allow acquisition of an SEM image in a specified field of view, edge detection of a pattern displayed on the SEM image and calculation of the area of the pattern are respectively performed in the system controller 21 based on a stored program.

Further, processing to define a shape of a measurement specification region (ROI: Region Of Interest) specifying a measurement region of the acquired SEM image is performed. In addition, processing to display the ROI movably on the screen of the SEM image display 30 is performed.

Moreover, processing to rearrange the ROI at the optimum position in accordance with the size or shape of the pattern is performed for the initial ROI set by the user or automatically set by a CAD database (not shown) in which design data information is saved, as described later.

(Corner Rounding Detection Processing on SEM Image)

Next, a description is given of corner rounding detection processing on an SEM image.

Figure 2A:
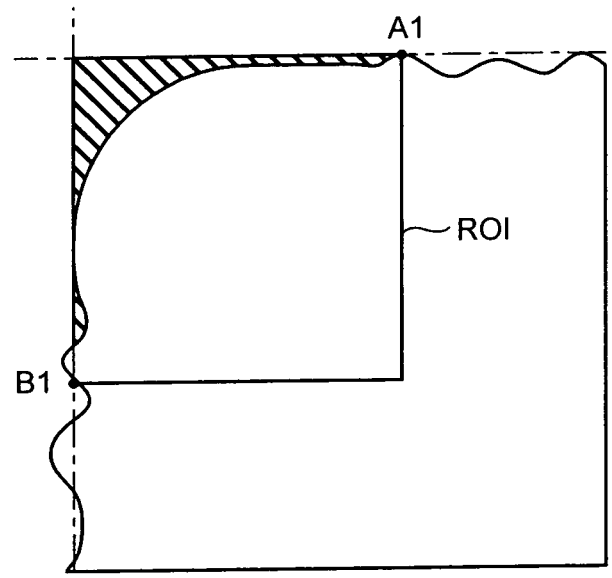
FIGS. 2A and 2B are diagrams for describing calculation of a loss area of a corner.
Figure 2B:
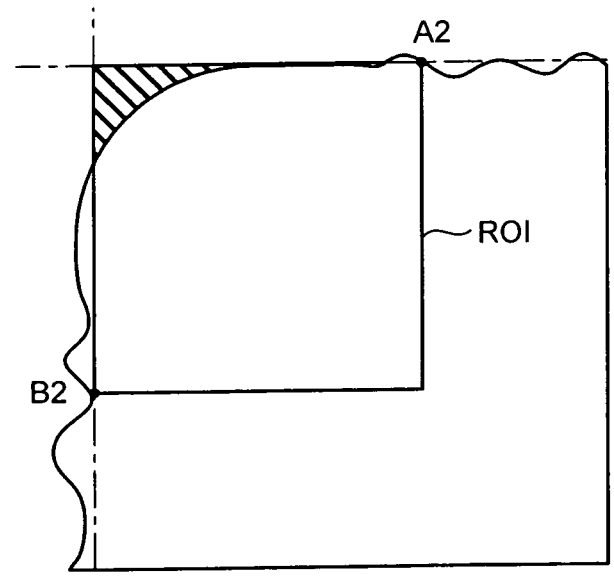

FIGS. 2A and 2B are diagrams for describing general corner rounding detection processing. FIGS. 2A and 2B show a portion (one of corners) of an SEM image of a contact hole formed as a pattern. As shown in this SEM image, edge roughness exists on the profile of the pattern. Further, as shown in FIGS. 2A and 2B, an ROI is set at a measurement target position for measuring corner rounding of the pattern. Typically, the operator manually performs the setting of the ROI while the SEM is displayed. Alternatively, the ROI may be automatically set at the position on the basis of the data of a design coordinate of the position or the size of the ROI, which is set by using a CAD database (not shown) and read by the scanning electron microscope 100 through a file or the like. In the setting of an ROI by the design data or the operator, however, a corner of the ROI may not coincide with a side of the SEM image of the pattern. In such a case, the position of the ROI is adjusted by detecting the distance between the position of the corner of the ROI and the side of the SEM image and then setting the distance to zero or the like so that the corner of the ROI coincides with the side of the pattern of the SEM image.

FIGS. 2A and 2B each shows a state where corners of an ROI and sides of an SEM image of a pattern are adjusted to coincide (intersect) with each other in the manner described above.

In FIG. 2A, the corners of the ROI intersect with the sides of the SEM image of the pattern at points A1 and B1, respectively. Meanwhile, in FIG. 2B, the corners of the ROI intersect with the sides of the SEM image of the pattern at points A2 and B2, respectively. As shown in the drawings, the positions where the corners of the ROI and the sides of the SEM image of the pattern intersect will change depending on edge roughness of the SEM image of the pattern only by changing the size of the ROI.

The loss area of a corner is obtained by subtracting the area of the corner portion from the area of an ROI. Accordingly, the loss area of the corner portion fluctuates even with the same pattern between the cases where the ROI is set in the manner shown in FIG. 2A and where the ROI is set in the manner shown in FIG. 2B.

In this embodiment, optimization processing in accordance with the shape or the size of the pattern is performed for reducing the influence of edge roughness of an SEM image of a pattern as much as possible to improve the measurement accuracy of corner rounding. The optimization processing is described below with reference to FIGS. 3 to 7B.

Figure 3:
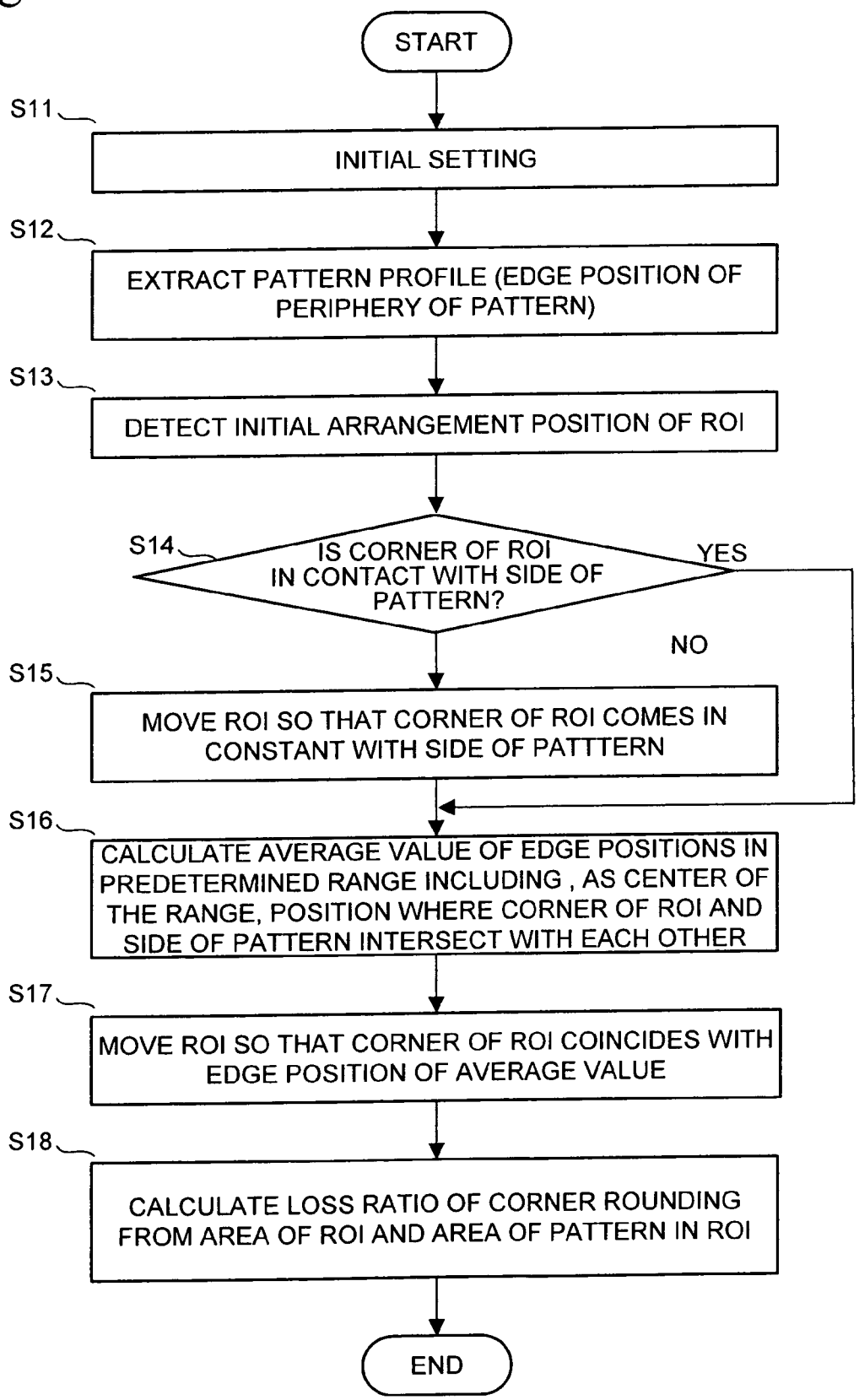
FIG. 3 is a flowchart showing an example of corner rounding measurement processing.

FIG. 3 is a flowchart showing an example of corner rounding measurement processing performed by the system controller 21. Note that, in this processing, an SEM image of a pattern is assumed to be already acquired and stored in the storage unit 40.

First, an initial setting is performed in step S11 shown in FIG. 3. In this initial setting, the size of an ROI and an acquisition range of position data in optimum rearrangement processing for the position of the ROI to be described later are set. In addition, a threshold defining the tolerance of fluctuation of a coordinate position is set in this initial setting.

Next, in step S12, the profile of the pattern, i.e., edge positions of the periphery of the pattern are detected.

Figure 4:
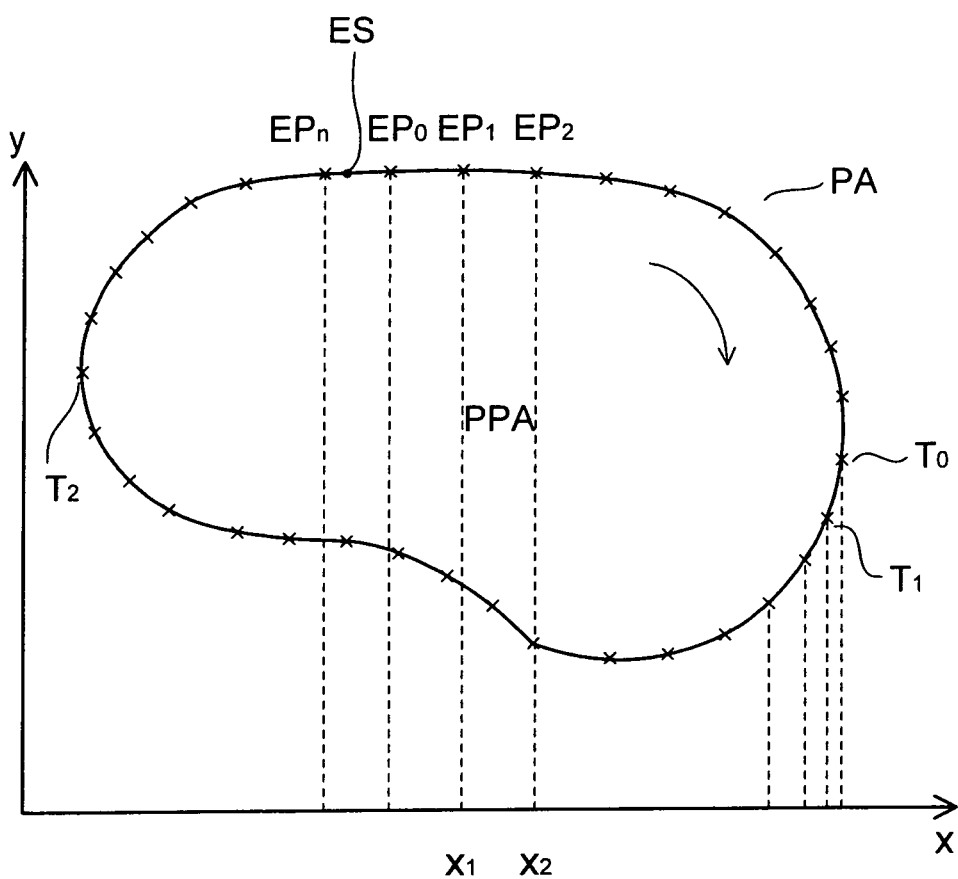
FIG. 4 is a diagram showing an example of a pattern to be set as a profile measurement target.

Here, the edge detection processing for the periphery of a pattern is described with reference to FIGS. 5 through 6D while a pattern having the shape shown in FIG. 4 is used as an example.

Figure 5:
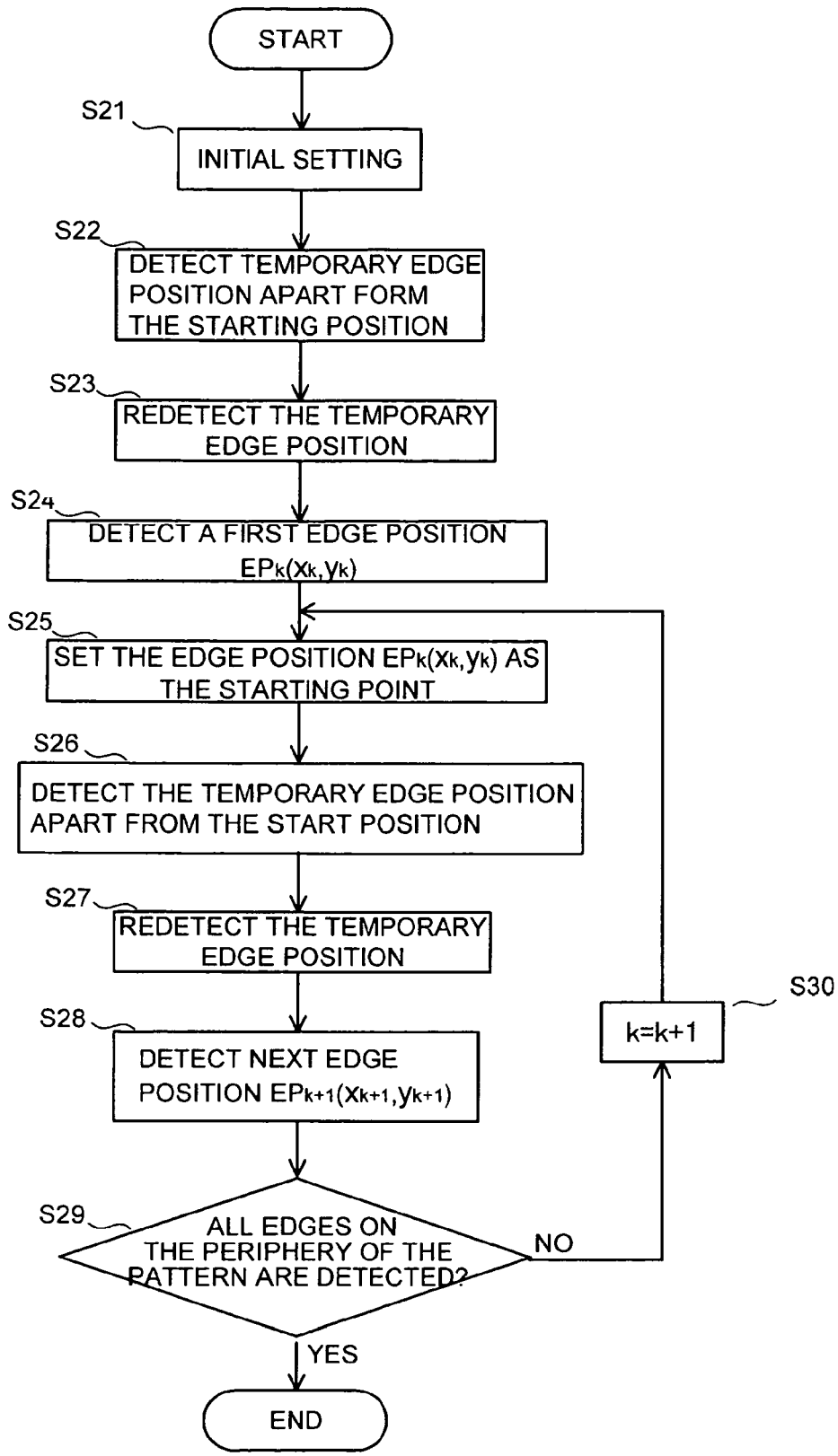
FIG. 5 is a flowchart showing an example of pattern profile measurement processing.

FIG. 5 is a flowchart showing an example of the edge detection processing for the periphery of a pattern. In addition, FIGS. 6A to 6D are diagrams for describing edge detection of the periphery of the pattern. Here, a starting position ES for detecting an edge position of the periphery of the pattern is assumed to be set in advance.

First, an initial setting is performed in step S21 shown in FIG. 5. In the initial setting, a predetermined interval for detecting an edge of the periphery of the pattern (hereinafter, referred to as a "specified step") is specified. The specified step is set to be a distance corresponding to a predetermined number of pixels, for example. In addition, a counter k showing the position of a detection edge of the periphery of the pattern is set to 0.

Next, from step S22 to step S24, edge positions apart from the starting position ES by a predetermined specified step d are detected.

In step S22, a temporary edge at a position apart from the starting position ES by a distance (specified step d×2) is detected. Specifically, as shown in FIG. 6A, a line profile is created using a line HL as the reference line, and an edge $E_{11}$ is detected. Here, the line HL orthogonally crosses a straight line VL at a position on the straight line VL apart from the starting point ES by the distance (specified step d×2), and the straight line VL extends downward (−Y direction) in FIG. 6A. The detected edge $E_{11}$ is termed as a temporary detected edge $E_{11}$. Note that, the edge is detected in −Y direction from the starting position ES in FIG. 6A, but the edge may be detected in X direction from the starting position ES depending on the shape of the pattern.

Next, in step S23, the temporary detected edge $E_{11}$ detected in step S22 is redetected. A line orthogonally crossing a straight line $IL_1$ at a position apart from the starting position ES on the straight line by the distance (specified step d×2) is set as a reference line $RL_1$ for creating a profile. Here, the straight line noted above connects the starting position ES and the temporary detected edge position $E_{11}$. Then, a line profile on the reference line is found, and the temporary detected edge position is redetected in step S23. as denoted by $E_{12}$ in FIG. 6B. By the redetection of this temporary detected edge position, the distance from the starting position ES to the temporary detected edge position is made closer to the distance (specified step d×2).

Next, in step S24, a first edge position is detected. A line profile on a line orthogonally crossing the straight line $IL_1$ at an intermediate position $MP_1$ (specified step d from the starting position ES) is found, and an edge $EP_k(x_k, y_k)$ is detected. As noted above, the straight line $IL_1$ connects the starting position ES and the redetected temporary detected edge position $E_{12}$. In FIG. 6B, an edge $EP_1$ is detected as the first edge. By detecting the edge $EP_k(x_k, y_k)$ as described above, the edge on the line nearly perpendicular to the periphery of the pattern can be detected. Thus, the edge position can be accurately detected.

Next, in step S25, the edge $EP_k(x_k, y_k)$ is used as the starting point for the next edge detection. In FIG. 6C, the edge $EP_1$ is set as the starting point.

From step S26 to step S28, an edge position $EP_{k+1}(x_{k+1}, y_{k+1})$ apart from the starting edge position $EP_k(x_k, y_k)$ by the specified step d is detected.

In step S26, a line profile is created using a line orthogonally crossing a straight line $IL_2$ at a position apart from the starting point $EP_1$ by the distance (specified step d×2) as a reference line $RL_2$ for creating the profile, and an edge is detected. Here the straight line $IL_2$ connects the starting point $EP_1$ and the redetected temporary detected edge $E_{12}$. The edge detected here is termed as a temporary detected edge $E_{21}$ as shown in FIG. 6C.

Next, in step S27, in the same manner as step S24, a line orthogonally crossing a straight line $IL_3$ at a position apart from the starting point $EP_1$ by the distance (specifying step d×2) is set as a reference line $RL_3$ for creating a profile as shown in FIG. 6D. Here, the straight line connects the starting point $EP_1$ and the temporary detected edge position $E_{21}$. Then, the line profile on the reference line is found, and the temporary detected edge position is redetected as denoted by $E_{22}$.

Next, in step S28, a line profile on a line orthogonally crossing the straight line $IL_3$ at an intermediate position $MP_2$ is found, and the edge $EP_{k+1}$ is detected. As noted above, the straight line $IL_3$ connects the starting point $EP_1$ and the redetected temporary detected edge position $EP_{22}$. In FIG. 6D, the edge $EP_2$ is detected as the second edge.

Next, in step S29, whether or not all edges on the periphery of the pattern are detected is determined. When it is determined that all the edges are detected, the processing is terminated. When it is determined that all the edges are not detected, the processing moves to step S30.

In step S30, k=k+1 is set. Then, the processing moves to step S25, and the next edge position is detected.

By the aforementioned processing, the edge positions of the periphery of the pattern are detected in the order of the $EP_0, EP_1, \ldots$ and $EP_n$ as shown in FIG. 4. As described above, to detect the edges on the periphery of the pattern, the next edge position is detected from the line profile on the line orthogonally crossing the straight at the intermediate position (specified step d), where the straight line connects the detected edge position and a temporary edge position apart from the detected edge position by a predetermined distance. Accordingly, the edges can be detected on the line nearly perpendicular to the periphery of the pattern. Thus, the edge position can be detected accurately.

Figure 7A:
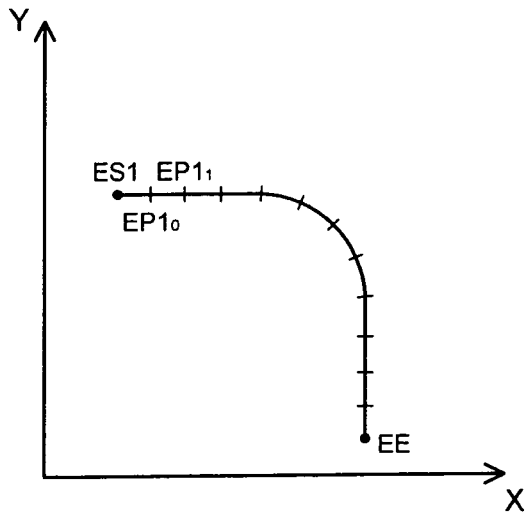
FIGS. 7A and 7B are diagrams for describing profile measurement and calculation of the area of a corner portion of a pattern.

FIG. 7A is a diagram for describing edge detection of a corner portion. While the edge detection for the periphery of the closed pattern is described in FIGS. 4 through 6D, here, edge detection of a corner portion of the periphery of a pattern is performed. Thus, the starting position ES1 and the end position EE for detecting edge positions are set for edge detection. Each of the starting position ES1 and the end position EE is set at a position having some margin so that all the edge positions in the ROI are included even when the ROI is rearranged.

Referring back to FIG. 3, an initial arrangement position of the ROI is detected in step S13. The initial arrangement position of the ROI is set by the operator or is set on the basis of CAD data.

Next, in step S14, whether or not corners of the set ROI are in contact with sides of the pattern is determined. If the corners are in contact with the sides, the processing moves to step S16 and if not, the processing moves to step S15. Whether or not each of the corners of the ROI is in contact with a corresponding one of the sides of the pattern is determined by detecting whether or not the coordinate position of the corner of the ROI overlaps with the profile line formed by connecting the coordinate positions of the profile of the pattern.

Next, in step S15, the ROI is moved to the position where the corners of the initially arranged ROI come in contact with the respective sides of the pattern. Here, the ROI is moved in such a way that the distance from each of the corners of the ROI to a corresponding one of the sides of the pattern is measured first, and then, the ROI is moved so that the distance can be set to zero.

Next, in step S16, the average value of the edge positions in a predetermined range is calculated, the predetermined range including, as the center of the range, the position where the corner of the ROI and the side of the SEM image of the pattern intersect with each other.

Figure 8A:
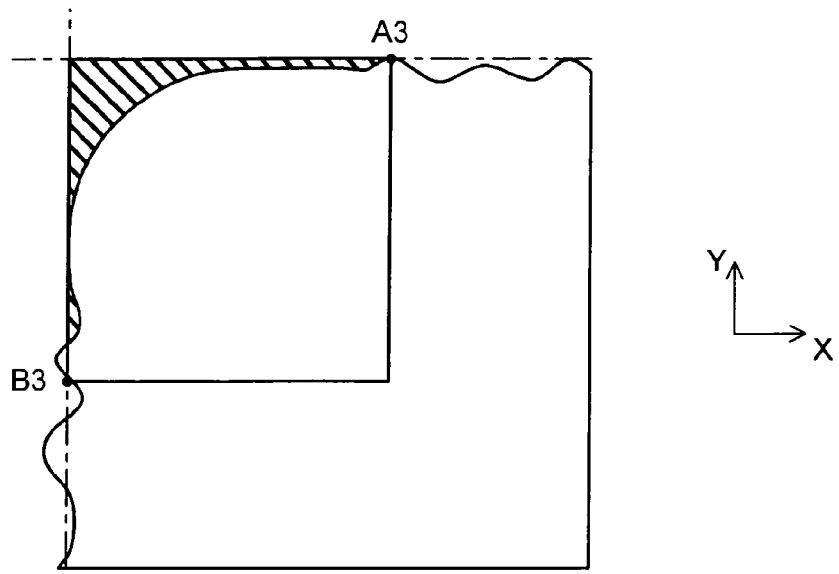
FIGS. 8A and 8B are diagrams for describing an optimum rearrangement of an ROI.
Figure 8B:
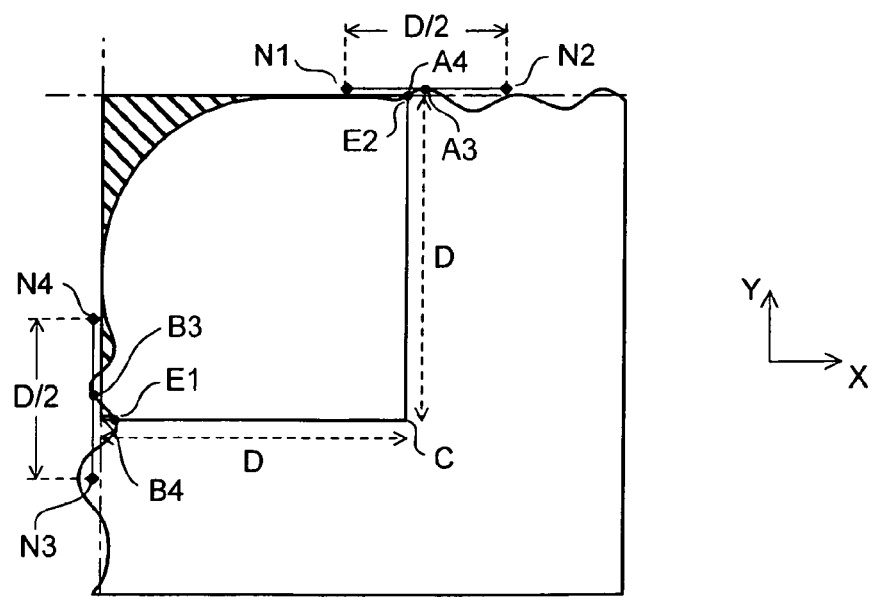

FIGS. 8A and 8B are diagrams for describing the optimum rearrangement processing for an ROI. As shown in FIG. 8A, the corners of the ROI are assumed to be intersecting with the sides of the pattern at points A3 and B3, respectively. Edge positions in X direction in a range of, e.g., ½ of a length D of one side of the ROI with the point A3 as the center are acquired from the SEM image of the pattern. The edge positions are acquired from the edge positions detected in step S12 and then stored in the storage unit 40. Then, the average value of the values of Y coordinates of the acquired edge positions is calculated. Likewise, edge positions in Y direction in FIG. 8B in a range of ½ of the length D with the point B3 as the center are acquired from the SEM image of the pattern. Then, the average value of the values of X coordinates of the acquired edge positions is calculated.

Here, ½ of the length of one side of the ROI is used as the predetermined range, but this value can be changed as appropriate.

Next, in step S17, the ROI is moved so that the corners of the ROI coincide with the edge positions corresponding to the average values obtained in step S16, respectively. FIG. 8B shows an example of an adjusted ROI. Specifically, the corner of the ROI is positioned to coincide with a position A4 corresponding to the average value of Y coordinates of the edge positions in the range of D/2 (between points N1 and N2) with the point A3 as the center. In addition, the corner of the ROI which is located opposite to the aforementioned corner over another corner is positioned to coincide with a position B4 corresponding to the average value of X coordinates of the edge positions in the range of D/2 (between points N3 and N4) with the point B3 as the center.

Next, in step S18, a loss area of the corner rounding is calculated from the area of the ROI and the area of the pattern in the ROI, and a loss ratio of the corner rounding is calculated. Note that, the loss ratio is the proportion of the loss area with respect to the area of the ROI.

The area of the pattern is calculated in the following manner. For example, n+1 edge positions of the periphery of the pattern are detected as shown in FIG. 4, and the k-th edge position is set to $EP_k$ ($x_k$, $y_k$). With the application of trapezoidal rule using all the detected edge positions, an area S of the pattern is calculated by the following formula.

$$S = \sum_{k=1}^{n}\left((X_k - X_{k-1}) \times \frac{(Y_k + Y_{k-1})}{2}\right) + (X_0 - X_n) \times \frac{(Y_0 + Y_n)}{2}$$

In the example shown in FIG. 4, for the trapezoidal region defined by the edge positions from $T_2$ to $T_0$ on the upper side of a pattern PA, an area combining regions PPA divided from a pattern PA, such as a region ($x_1$, $x_2$, $EP_1$, $EP_2$) with a region not including the pattern is calculated. Meanwhile, for the trapezoidal regions defined by the edge positions from $T_1$ to $T_2$ on the lower side of the pattern PA, an area not including the pattern PA is calculated.

Accordingly, the area of the pattern PA is calculated by adding the trapezoidal regions defined at the edge positions from the $T_2$ to $T_0$ on the upper side of the pattern PA, and subtracting the trapezoidal regions defined at the edge positions from the $T_0$ to $T_2$ on the lower side of the pattern PA.

Figure 7B:
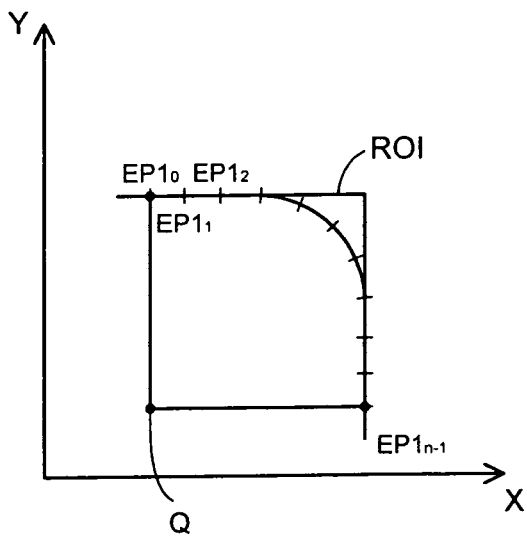

FIG. 7B is a diagram showing the calculation of the area of a corner portion. The area of a corner portion of the pattern is calculated by using the edges included in the region of the ROI among the edges detected as shown in FIG. 7A. As shown in FIG. 7B, a point Q at the lower left corner of the ROI is added as an edge position $EP1_n$, and the edge positions $EP1_0$ to $EP1_n$ are assigned to the aforementioned area calculation formula. Thus, the area of the corner portion of the pattern is calculated.

In the case shown in FIG. 8B, a point C at the lower right corner of the ROI is added as an edge, and the edge positions are assigned to the aforementioned area calculation formula for the edges E1 and E2 included in the region of the ROI. Thus, the area of the corner of the pattern is calculated.

The aforementioned processing is performed for each corner set as the measurement target of the pattern.

Note that, the aforementioned processing is described using the right upper corner as the target, but the processing is not limited to the right upper corner and can be applied to a corner pattern in any direction. Still, a change may be needed in the optimization processing for the rearrangement of an ROI depending on the shape or size of the pattern.

FIGS. 9A to 9D show an example of an SEM image observed in a case where the area of a contact hole is small. As shown in FIG. 9A, the SEM image shown is substantially a circle in this case. Note that, in FIGS. 9A to 9C, the ROI is set at the upper left corner in each of the drawings, and edge roughness is shown only at target positions.

When the averaging processing for the rearrangement of the ROI is performed in a case where an ROI 81 as shown in FIG. 9A is set, the ROI 81 is rearranged and moved to the position of an ROI 82 as shown in FIG. 9B. In this case, the ROI is rearranged at an inappropriate position. This is because the edge positions of the corner portion are included as the data for the averaging processing.

In this respect, when the area of the pattern is small as shown in FIG. 9A, edge positions are extracted in the following manner. Specifically, if edge positions having an edge position coordinate with a value outside a predetermined value (threshold) are continuously detected during the extraction of edge positions in a predetermined range, the edge positions having such an edge position coordinate are not included in the target of the averaging processing. Here, the predetermined range includes a point (E3, E4) intersecting with the ROI 81, as the center of the range.

FIG. 9D is a diagram showing a relationship between a predetermined range D2 and a threshold T1 for the averaging processing when a position where the corner of the ROI and the side of the pattern intersect with each other is termed as a point N9 in the case where the area of the pattern is small. As shown in FIG. 9D, when edge positions are detected in a direction from points N9 to N7 in the predetermined range D2, the edge positions corresponding to the point N7 and points after the point N7 become outside the threshold T1 continuously. In such a case, an adjustment is made so that the value of Y coordinate of the ROI in the range D2 coincides with the value (N9) of Y coordinate corresponding to the outermost position in a direction perpendicular from the side along the pattern edges of the ROI. Likewise, an adjustment is made for the position of the corner opposite to the aforementioned corner over another corner so that the value of X coordinate in a predetermined range can coincide with the value of X coordinate corresponding to the outermost position in a direction perpendicular from the side along the pattern edges of the ROI.

For the case shown in FIG. 9A, the ROI is rearranged so as to circumscribe the SEM image of the pattern as shown in FIG. 9C. Specifically, the ROI 82 is adjusted to the position of an ROI 83 so that the corners of the ROI 82 can coincide with the outermost positions (N5 and N6) of the SEM image of the pattern.

In addition, when the edge position coordinates having a value outside the threshold occur continuously, the average value in the range within the threshold may be calculated, and then, the ROI is rearranged so that the corner of the ROI coincides with the average position. For example, in FIG. 9D, the average value of the coordinate positions within the range from the point N7 to the point N8 is calculated.

Figure 10:
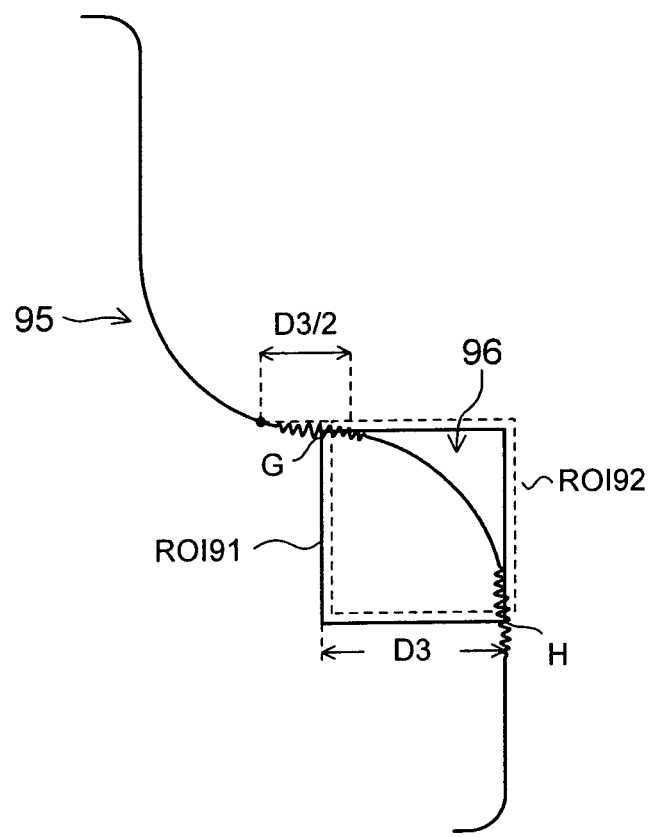
FIG. 10 is a diagram for describing the optimum rearrangement of an ROI for a case where a measurement target pattern has a special shape.

FIG. 10 shows an example of a pattern of another special case in which a pattern formed of a recessed corner 95 and a protruding corner 96 are arranged in a continuous manner. In this case, when an ROI 91 is set in the manner shown in FIG. 10, the average value of the position coordinates in predetermined ranges respectively having points G and H as the center is calculated, and the ROI is rearranged so as to correspond to the average values. In this case, since a portion near a corner 95 is included in the calculation range of the average value, the ROI may not be rearranged appropriately.

In addition, if the processing for a case where edge coordinate positions having a value outside a predetermined value (threshold) occur continuously is applied as described in FIGS. 9A to 9D, the ROI is rearranged at an ROI 92 because the processing to cause the corner of the ROI to coincide with the outermost positions is performed in this case. As a result, the loss area becomes large in this case. Accordingly, the application of this processing is not appropriate.

For this reason, when it is determined that a corner pattern continuous from the edge position of the pattern has a shape in which a recessed corner and a protruding corner are formed in a continuous manner, the averaging processing is performed in such a way that the range in which the average value is to be calculated is set to be within the range of the ROI not exceeding from each of the corners (G and H) of the ROI.

As described above, according to the pattern measurement apparatus and the pattern measurement method of the present embodiment, edge positions in a predetermined range are detected for an ROI (region of interest, i.e., measurement specification region) which is set for measuring corner rounding of a pattern, and the ROI is adjusted in accordance with the edge positions. For example, the average value of the edge positions within a predetermined range including, as the center of the range, a point where a corner of the ROI and a side of the pattern intersect with each other is calculated, and the ROI is moved so that the corner of the ROI coincides with the position corresponding to the average value.

In addition, when the size of a pattern is small, and the SEM image is substantially a circle, a straight-line portion of a predetermined range becomes short, where the predetermined range includes the position of the corner of the set ROI as the center of the range. In this case, the ROI is rearranged so that the corner of the ROI coincides with the outermost position in a direction perpendicular to the side along the edges of the pattern of the ROI. Accordingly, the influence of edge roughness appearing on the SEM image of the pattern can be minimized, and the measurement accuracy of, for example, a loss area and a loss ratio of the corner rounding can be improved.

Note that, according to an experiment conducted by the inventor of this application, it has been confirmed that the measurement accuracy of the loss area has improved by approximately 50% as compared with a case where the position of the ROI is not rearranged.

What is claimed is:

1. A pattern measurement apparatus comprising:
   an irradiation unit for irradiating a sample with an electron beam;
   an electron detection unit for detecting an amount of electrons generated, by the electron beam radiation, from the sample on which a pattern is formed;
   an image processor for generating an SEM image of the pattern on the basis of the amount of electrons; and
   a controller for acquiring a rectangular measurement specification region specifying a measurement target portion of the SEM image, and then calculating a loss ratio of a corner portion of the pattern from an area of the measurement specification region and an area of the corner portion of the pattern,
   wherein the controller sets a position of the rectangular measurement specification region so that a pair of corners arranged on an oblique of the rectangular measurement specific region contains a corner portion of the pattern, and then sets the corner of the rectangular measurement specific region coincides with a side of the pattern of the SEM image;
   wherein the controller detects an average value of edge positions in a predetermined range of the pattern of the SEM image, where the predetermined range includes a position that the corner of the rectangular measurement specification region and the side of the pattern of the SEM image intersect with each other; and
   wherein the controller moves the rectangular measurement specification region so that the corners of the rectangular measurement specification region coincide with the edge positions corresponding to an average value of side positions of the pattern of the SEM image.

2. The pattern measurement apparatus according to claim 1, wherein the controller calculates an average position of the edge position in the predetermined range, and moves the measurement specification region in such a way that the corner of the measurement specification region coincides with the average position.

3. The pattern measurement apparatus according to claim 1, wherein, when the edge position in the predetermined range continuously exists at coordinate positions outside a predetermined threshold range, the controller moves the measurement specification region in such a way that the corner coincides with a coordinate position outermost in a direction perpendicular to a side along an edge of the pattern of the measurement specification region among coordinate positions in the predetermined range.

4. The pattern measurement apparatus according to claim 1, wherein, when the edge position in the predetermined range continuously exists at coordinate positions outside a predetermined threshold range, the controller moves the measurement specification region in such a way that the corner coincides with an average position of a length within the predetermined threshold range.

5. The pattern measurement apparatus according to claim 2, wherein, when determining that the pattern has a shape in which a recessed corner and a protruding corner are formed continuously, the controller limits the range for acquiring the average value to a range within the measurement specification region.

6. The pattern measurement apparatus according to claim 1, wherein the predetermined range includes the intersecting position as the center, and has a length that is a half of the length of a side of the measurement specification region.

7. A pattern measurement method in a pattern measurement apparatus including an irradiation unit for irradiating a sample with an electron beam; an electron detection unit for detecting an amount of electrons generated, by the electron beam radiation, from the sample on which a pattern is formed; and an image processor for generating an SEM image of the pattern on the basis of the amount of the electrons, the method comprising the steps of:
   acquiring a rectangular measurement specification region specifying a measurement target portion of the SEM image;
   setting a position of the rectangular measurement specification region so that a pair of corners arranged on an oblique of the rectangular measurement specific region contains a corner portion of the pattern, and then setting the corner of the rectangular measurement specific region coincides with a side of the pattern of the SEM image;
   detecting an average value of edge positions in a predetermined range of the pattern of the SEM image, where the predetermined range includes a position that the corner of the rectangular measurement specification region and the side of the pattern of the SEM image intersect with each other; and
   moving the rectangular measurement specification region so that the corners of the rectangular measurement specification region coincide with the edge positions corresponding to an average value of the side positions of the pattern of the SEM image.

8. The pattern measurement method according to claim 7, wherein the step of adjusting the measurement specification region includes the steps of:
   calculating an average position of edge positions in the predetermined range including the intersecting position; and
   moving the measurement specification region in such a way that the corner coincides with the calculated average position.

9. The pattern measurement method according to claim 7, wherein the step of adjusting the measurement specification region includes the steps of:
   determining whether or not the edge position in the predetermined range is continuously detected at coordinate positions outside a predetermined threshold range; and
   moving the measurement specification region in such a way that the corner coincides with a coordinate position outermost in a direction perpendicular to a side along an edge of the pattern of the measurement specification region among coordinate positions in the predetermined range when it is determined that the edge position is detected continuously at the coordinate positions.

10. The pattern measurement method according to claim 7, wherein the step of adjusting the measurement specification region includes the steps of:
    determining whether or not the edge position in the predetermined range is continuously detected at coordinate positions outside a predetermined threshold range; and
    moving the measurement specification region in such a way that the corner coincides with an average position of a length within the predetermined threshold range when it is determined that the edge position is detected continuously at the coordinate positions.

11. The pattern measurement method according to claim 8, wherein the step of adjusting the measurement specification region includes the steps of:
    determining shapes of corners which are continuous; and
    limiting the range for acquiring the average value to a range within the measurement specification region, when the continuous corners is determined to be in a pattern with a shape in which a recessed corner and a protruding corner exits continuously.

12. The pattern measurement method according to claim 7, wherein the predetermined range includes the intersecting position as the center, and has a length that is a half of the length of a side of the measurement specification region.

* * * * *